United States Patent
Kruit

(10) Patent No.: US 8,153,991 B2
(45) Date of Patent: Apr. 10, 2012

(54) DIRECT WRITE LITHOGRAPHY SYSTEM

(75) Inventor: Pieter Kruit, Delft (NL)

(73) Assignee: Mapper Lithography IP B.V., Delft (NL)

(*) Notice: Subject to any disclaimer, the term of this patent is extended or adjusted under 35 U.S.C. 154(b) by 33 days.

(21) Appl. No.: 11/149,893

(22) Filed: Jun. 10, 2005

(65) Prior Publication Data

US 2005/0224726 A1 Oct. 13, 2005

Related U.S. Application Data

(62) Division of application No. 10/391,956, filed on Mar. 19, 2003, now Pat. No. 6,919,952.

(60) Provisional application No. 60/365,843, filed on Mar. 19, 2002.

(51) Int. Cl.
*H01J 3/14* (2006.01)

(52) U.S. Cl. .............. 250/400; 335/210; 250/396 R; 250/399; 250/492.3; 438/942; 438/949

(58) Field of Classification Search .......... 250/400, 250/396, 399, 492.3; 335/210; 438/942, 438/949
See application file for complete search history.

(56) References Cited

U.S. PATENT DOCUMENTS

| | | | | |
|---|---|---|---|---|
| 4,954,717 A * | 9/1990 | Sakamoto et al. | ......... | 250/492.3 |
| 6,014,203 A * | 1/2000 | Ohkawa | .......... | 355/68 |
| 6,335,783 B1 * | 1/2002 | Kruit | .............. | 355/52 |
| 6,399,934 B1 * | 6/2002 | Sullivan et al. | ........... | 250/214 R |
| 6,429,443 B1 * | 8/2002 | Mankos et al. | ......... | 250/492.24 |
| 6,489,610 B1 * | 12/2002 | Barofsky et al. | .............. | 250/287 |
| 6,724,002 B2 * | 4/2004 | Mankos et al. | ......... | 250/492.24 |
| 7,068,882 B2 * | 6/2006 | Saito et al. | ........... | 385/33 |
| 2003/0002024 A1 * | 1/2003 | Motegi | ............ | 355/69 |
| 2003/0122091 A1 * | 7/2003 | Almogy | .................. | 250/492.24 |
| 2004/0135983 A1 * | 7/2004 | Wieland et al. | ................. | 355/67 |

FOREIGN PATENT DOCUMENTS

| | | |
|---|---|---|
| EP | 0321147 | 12/1988 |
| EP | 02224322 | 9/1990 |
| EP | 0605964 | 12/1993 |
| GB | 2164787 | 9/1985 |
| WO | WO 03/017317 | 2/2003 |

* cited by examiner

*Primary Examiner* — Michael Maskell

(74) *Attorney, Agent, or Firm* — Hoyng Monegier LLP; David Owen; Coraline Haitjema

(57) ABSTRACT

A direct write lithography system. The system includes a converter having an array of light controllable electron sources, each field emitter being arranged for converting light into an electron beam, the field emitters having an element distance between each two adjacent field emitters, each filed emitter having an activation area. A plurality of individually controllable light sources, each light source arranged for activating one field emitter. A controller controls each light source individually. Each electron beam is focused from the field emitters with a diameter smaller than the diameter of a light source on an object plane.

9 Claims, 4 Drawing Sheets

DIRECT WRITE LITHOGRAPHY SYSTEM

The present patent application is a Divisional of application Ser. No. 10/391,956, filed Mar. 19, 2003 now U.S. Pat. No. 6,919,952, which claims the benefit of U.S. Provisional Application No. 60/365,843, filed Mar. 19, 2002.

FIELD OF THE INVENTION

The present invention relates to a mask-less or direct write lithography system.

BACKGROUND

Current lithography systems are mostly all optical, deep UV systems. These systems use light in the deep UV region, i.e. 193 nm. Due to the fact that these systems are all optical, the resolution is limited.

One way of realising smaller resolutions is by using particle beams, especially electron beams. A known system uses masks just like all optical systems. The masks are situated between a substrate and an electron source in order to blind off parts of the electron beam. In that way, patterns are transferred to a resist. The system, however, has its drawbacks. First, the details on the mask have to be very small, about 100 nm, making these masks very difficult to produce. Furthermore, as electron beams are more energetic than light beams, the mask heats up.

Another way of increasing the resolution is disclosed in WO 98/54620. In this system, a conventional optical system using a mask is combined with an electron beam system. A light source produces a light beam, preferably in deep UV. The light beam impinges on a micro lens array having a plurality of lenses. The micro lens array divides the light beam into light beamlets. In practice, there may be as many as $10^7$-$10^8$ light beamlets. The lenses of the micro lens array focus the light beamlets on a mask. The light leaving the mask passes a de-magnifier. The demagnifier focuses the light beamlets on a converter plate having a plurality of converter elements, Each converter element arranged for converting impinging light into an electron beam. The spot size of each electron beamlet is 100 nm or smaller, making the lithography system capable of writing details smaller than 100 nm. This system uses a mask and a complex optical system. The distance between two adjacent converter elements is in general larger than the width of an electron beam resulting from a converter element. A method of transferring a pattern onto a wafer, is scanning the mask with the light beamlets and simultaneously scanning the wafer with the electron beamlets. The mask is moved in one direction and at the same time, the wafer is moved in the opposite direction. The lithography system disclosed in WO 98/54620 uses a system of demagnifying optics, micro lens array, UV beam and mask to activate converter elements.

An alternative to these systems is a mask-less lithography system or so called 'direct write' system. Many direct write systems, in particular direct write systems using electron beams, are known in the art.

A very simple embodiment uses one cathode producing an electron beam with a very small diameter, less than 100 nm. By scanning this beam over a substrate and switching it on and off, a pattern can be transferred to the substrate. This is called raster scanning. Such a system using raster scanning method is very slow.

Alternatively, a system using line of cathodes is known. Using a line of electron beams, an entire strip of a pattern can be transferred at the same time. Still this system is not fast enough for transferring an entire pattern onto a wafer fast enough for mass production purposes.

Another system, for instance disclosed in WO 98/48443, comprises an array of cathodes. By switching individual cathodes on and off, all at the same time, a first part of a pattern is created. Using electron lenses, this part of the pattern is reduced in size in its entirety as if the electron beams were one single beam, and the part of the pattern is transferred to the substrate. After this step, a second part of the pattern is created by switching other cathodes on and off. This second part is subsequently transferred to the substrate, and so on, until a complete pattern is transferred to the substrate. One disadvantage of this method is that the electron beams are very close together. Due to aberrations of the electron lenses, a lot of distortion occurs. Furthermore, as the beams have to be focussed, use is made of lenses causing the beams to converge at one point along the beam path, causing even more problems due to coulomb interactions. Furthermore, processing time is a problem, because the writing field is small, which necessitates many movements of the wafer stage.

Yet another known system is described in U.S. Pat. No. 5,969,362. This system requires a multitude of cathodes, very closely spaced: 600 nm or less. The cathodes are electrically activated using a grid of wires. The system thus requires complex electrical systems for controlling a large number of cathodes. It is difficult to prevent crosstalk between the electrical systems as they are very close together. An entire pattern is transferred by moving the wafer in the X-Y plane using the wafer stage, putting a heavy burden on the mechanical system.

Another known system is described in U.S. Pat. No. 6,014,203. In this system, a field emission array comprising as many as $10^7$ cathodes per square cm is used as an electron beam source. The field emission array is provided with photodiodes. These photodiodes are optically activated and on their turn electrically activate the cathodes. A pattern is transferred by projecting a multitude of LCD displays subsequently onto the photodiodes of the field emission array, requiring a complex optical and mechanical system. The system further comprises a focussing magnet and a steering magnet. Using the steering magnet, each electron beam is scanned in the X- and Y direction. All the electron beams are scanned simultaneously. In order to realise a high data rate, a multitude of LCD screens are one by one projected on the field emission array, requiring a complex optical and mechanical system. And even using very many LCD screens, it is still not possible to realise the data rate needed for the economical feasible production of chips.

Still another approach concerns a system which splits one electron beam up into a plurality (for instance 64×64) of small electron beams. Each small beam has its own electrostatic lens system reducing the size of each small beam. Furthermore, the lens system scans each beam over an area of, e.g., 4×4 microns. Furthermore, a blanking aperture array is provided and a deflector for each small beam. The deflector is capable of deflecting a small beam out of the aperture area, thus blanking the small beam when needed. The system uses wafer stage scanning to transfer a complete pattern. With this system, however, it is not possible to obtain high productivity, because the writing field is small, which also necessitates many movements of the wafer stages.

SUMMARY OF THE INVENTION

It is an object of the present invention to overcome the disadvantages of prior art direct write systems by providing a lithography system using a plurality of simultaneous scanning electron beams which can be individually activated by light.

The direct write lithography system of the present invention comprises a converter comprising: an array of light controllable electron sources, each electron source being arranged for converting light into an electron beam and each electron source having an activation area; a plurality of individually controllable light sources, each light source arranged for activating one electron source; controller means for controlling each light source individually; and focussing means for focussing each electron beam on an object plane and with a diameter smaller than the diameter of an individually controllable light source.

Using individually controllable light source, each field emitter can be switched on and off very fast. Furthermore, a light source can be switched on and of, or modulated, very fast. If needed, light sources can be modulated at GHz speeds. This makes it possible to transfer a complete pattern to a wafer very fast.

To illustrate the complication of writing patterns with sufficient speed, one needs to realise that in current mask-based optical systems it is possible to write 25 mm×25 mm patterns in less than 1 second. If the patterns need to consist of 50 nm wide lines, such a 25 mm×25 mm pattern has $0.25 \times 10^{12}$ squares of 50 nm×50 nm. Using a direct write system, each square has to be written with (or built up using) 9 to 25 dots, which leads to at least about $2 \times 10^{12}$ to $6 \times 10^{12}$ dots to be written within 1 second, in order to obtain the processing speed of a sample of a mask-based system. Each dot needs to have the correct gray-level, chosen from i.e. 8 or 32 gray levels. A single beam can write typically $0.25 \times 10^9$ dots per second. A fast direct write system of the current invention would thus require about $10^3$ to $10^5$ separate, simultaneously operating beams.

In an embodiment of the invention, the lithography system further comprises first scanning means for scanning the electron beams from the field emitters in a first scan direction. This makes it possible to transfer a pattern fast without the need for very fast wafer movement.

In an embodiment of the lithography system of the invention, the system additionally comprises displacement means for moving the object plane and the converter with regard to each other in a second scan direction which second scan direction is at an angle between 0 and 180 degrees with the first scan direction. This makes it possible to transfer a pattern very fast. Especially in combination with the embodiment above, using the scanning means in combination with the displacement means, it is possible to reduce the number of field emitters needed to transfer a pattern.

In a further embodiment, the converter is arranged for being activated by individual light sources, capable of producing a light spot with a diameter of 200-2000 nm on the converter and having elements arranged for producing individual electron beams, each with a diameter smaller than 100 nm, in a further embodiment smaller than about 40 nm. In this way, the illumination can be relatively large compared to the electron beams, reducing the mechanical complexity of the lithography system, while still being able to obtain a high resolution and high speed. Because of its larger size, it allows crosstalk reduction of electrical wiring systems.

In a further embodiment, the first scan direction is substantially perpendicular to the second scan direction. In this embodiment, the first scanning means are adapted to scan the electron beams in a first scan direction substantially perpendicular to the second scan direction. In an embodiment, the first scanning means comprise magnetical means for sweeping the electron beams in the first scan direction. These means can sweep all the electron beams simultaneously and displace the beams with the same amount. In another embodiment, each electron source comprises a system of electrostatic lenses. These two embodiments can also be combined to obtain maximum freedom of design.

In a further embodiment, the electron sources form an array with columns and rows of field emitters, and the second scan direction is at an angle unequal to zero with one of the columns and rows. In this way, it is possible to write a complete pattern covering an entire area. In an embodiment thereof, said angle is about 0.1 to 15 degrees.

In an embodiment of the current invention, the individually controllable light sources are an array of light emitting diodes (LEDs). These LEDs can be switched on and of individually, on independently from the other, even from its direct neighbour. In another embodiment, the light sources are lasers, like semiconductor lasers. These light sources can be switched very fast. These light sources are furthermore easily arranged in an array for instance an array corresponding to the electron sources.

In a further embodiment, the lithography system further comprises means for directing the light from each light source to one activation area of the converter plate. In this way, it is possible to locate the light sources away from the converter plate, even outside the vacuum in which the converter plate will be located. In an embodiment thereof, each individually controllable light source comprises an optical fiber, having a first end directed to a converter element and a second end arranged for receiving light. In this way, the light sources can be at a location away from the converter plate. Furthermore, it is possible to reduce crosstalk between the light sources, by making sure that each light source illuminates only one activation area, and thus activates only one electron source.

In another embodiment, each light source further comprises a semiconductor laser, each semiconductor laser arranged for coupling its light into one of the optical fibers.

In another embodiment of the invention, the plane of the electron sources is imaged onto the object with a set of conventional electron lenses as if the electron beams were one single beam. The plane with electron sources may be imaged with a magnification of 1, or with a magnification different from 1. The advantage of this embodiment is that the object does not need to be placed inside a magnetic field.

In a further embodiment, the electron sources are semiconductor field emitters. These sources are easy to produce.

The invention further relates to a method of producing a pattern on a substrate, wherein data is retrieved from a data storage means on at least one computer system, said data representing the pattern to be produced on said substrate, said data is processed in said computer and converted into signals activating and deactivating individually controllable light sources, and said individually controllable light sources are projected on a converter comprising a plurality of electron sources arranged for converting light into an electron beam, each electron source having one activation area, each individually controllable light source producing a light spot on one activation area.

The invention further relates to a direct write or mask-less lithography system comprising:

A converter comprising an array of light controllable field emitters, each field emitter being arranged for converting light into an electron beam, the field emitters having an element distance between each two adjacent field emitters, each field emitter having an activation area;

A plurality of individually controllable light sources, each light source arranged for activating one field emitter;

Controller means for controlling each light source individually;

Focussing means for focussing each electron beam from the field emitters with a diameter smaller than the diameter of a light source on an object plane.

The invention further relates to a semiconductor element, processed using a lithography system according to the current invention, and to a method for processing a substrate, for instance a semiconductor wafer, using a lithography system according to the current invention.

BRIEF DESCRIPTION OF THE DRAWINGS

The invention will now be explained with reference to the drawings which are only intended to illustrate the invention and not to limit its scope of protection. In the drawings, similar reference numerals indicate similar parts.

DESCRIPTION OF PREFERRED EMBODIMENTS

Figure 1:
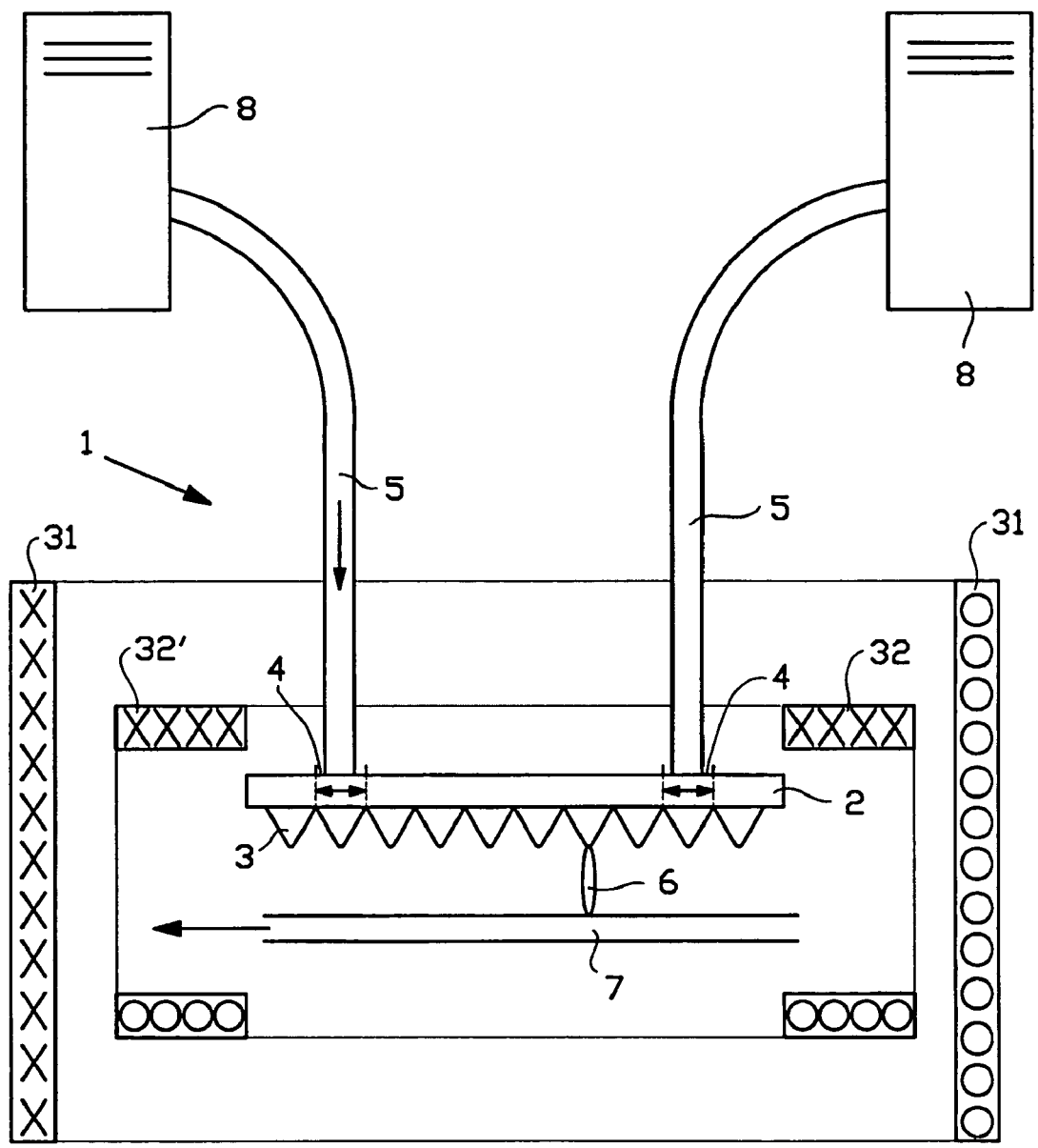
FIG. 1 shows a direct write lithography system of the invention using optical fibers.

FIG. 1 shows a direct write or mask-less lithography system 1. The system comprises converter plate 2, for instance a field emission array, in an embodiment for instance a semiconductor field emission array. Such a field emission array comprises a two-dimensional array of cathodes 3. In case the field emission array is a semiconductor field emission array, the cathodes are tips or needles of semiconductor material, like silicon tips. An example of a usable field emission array is described in PCT/NL00/00657 and PCT/NL00/00658. Each tip is capable of emitting an electron beamlet 6. Each tip has an activation area 4 on the side of the field emission array opposite to the cathodes 3. This activation area 4 is much wider than the electron beamlet 6: usually, the activation area 4 is about 2 microns wide, and the cross section of an electron beamlet is less than 100 nm, and can even be as small as 10 nm. Each electron beamlet 6 is projected onto a substrate 7, usually a semiconductor wafer. This kind of electron sources converts light into an electron beam.

The cathodes 3 of the converter plate 2 are activated by light, falling onto the activation area 4. In order to avoid cross talk (activation of a neighbour cathode), the cross section of a light beam activating a cathode has to be smaller than the activation area 4. Furthermore, for further reducing cross talk, each light beam should be well aligned with an activation area. In one embodiment, each activation area 4 is illuminated by an optical fiber 5. Thus, when using for instance a converter plate with about $10^4$ cathodes, about $10^4$ optical fibers are needed to activate all the cathodes.

Light for activating a cathode is thus transported to the activation area using optical fibers. This light is generated by a plurality of individually switchable light sources, for instance semiconductor lasers. In this embodiment, each optical fiber is connected to a semiconductor laser, and electronical or optical means for coupling light, generated by the light sources, into each optical fiber. The light on the activation area 4 can be switched on for instance by switching each light source on and off. Another way of generating light on the activation area is using an optical switch to couple light from LED's of semiconductor lasers into and out of the optical fibers. The light sources (or optical switches controlling the light sources) are controlled using one or more computer systems 8. In these ways, a very high data rate can be obtained: light can be modulated at GHz rates, making it possible to attain $10^{13}$ pixels per second. In this way, a 25 mm×25 mm square can be written each 0.3 seconds.

Figure 3:
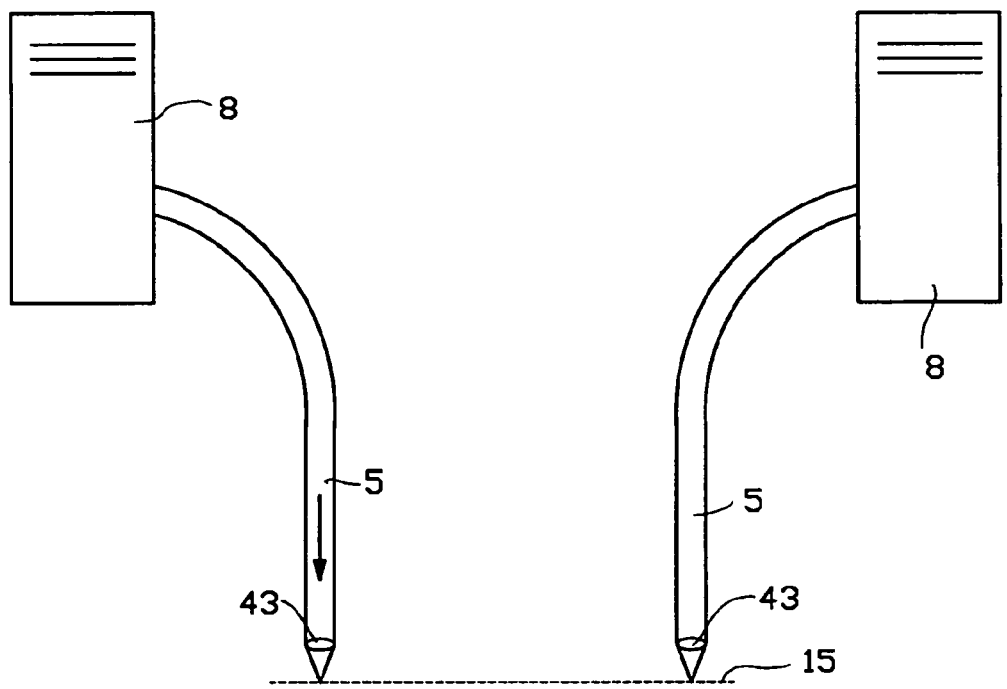
FIG. 3 shows an embodiment of a direct write lithography system of the invention using a combination of optical fibers and a de-magnifier.
Figure 3:
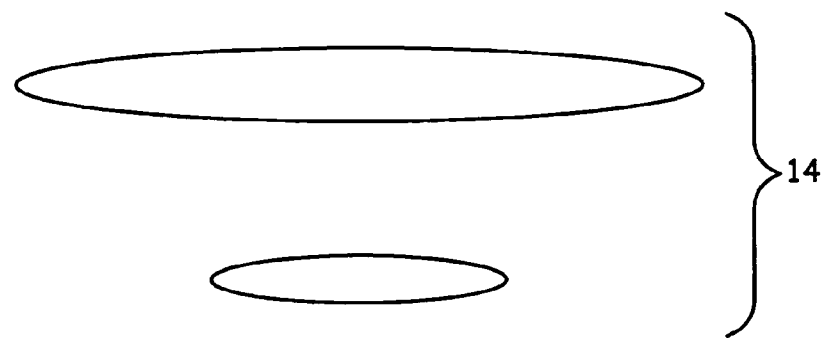
Figure 3:
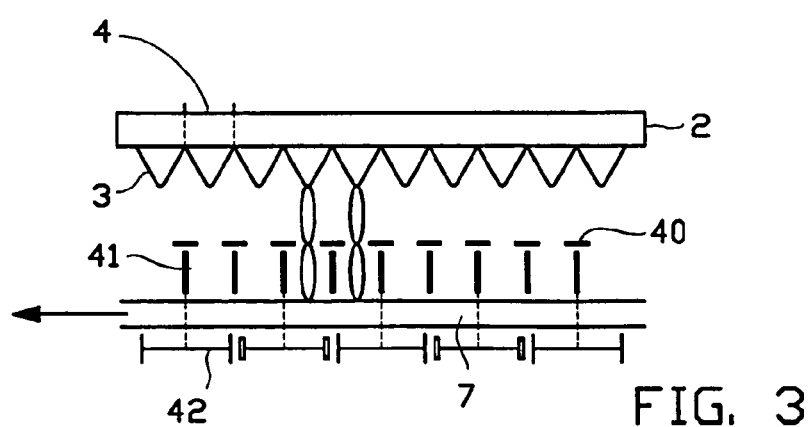

The electron beamlets 6 are accelerated towards the object 7. A coil 31 provides the magnetic field for focussing the electron beamlets. Alternatively, each beamlet is focussed by a miniature electrostatic lens. The beamlets 6 are collectively scanned by the magnetic field produced by coils 32 and 32'. The scanning magnetic field is typically much weaker than the focussing field, i.e. in the order of $10^{-4}$ Tesla compared to in the order of about 1 Tesla for the focussing magnetic field. In a further embodiment, the scanning coils 32, 32' consist of current carrying plates, positioned very closely above and below the beamlets 6. One of the current carrying plates can even be combined with the aperture plate described in PCT/NL02/00541. In this embodiment, current flows through the aperture plate and the converter plate, parallel with regard to the substrate 7. This results in a magnetic field only between the converter plate and the aperture plate. The aperture plate is depicted in FIG. 3, but can also be applied in the other embodiments.

The optical system of optical fibers, computer systems, light sources and, if needed, optical switches, and other optical components, all comprise components known from the field of optical telecommunication. In order to reduce the amount of fibers running from the computer system to the converter plate, known methods of multiplexing and demultiplexing, known from the field of telecommunication, can be used. Specifically, the light used to activate the electron sources can be in the visual light range, for instance red (about 700-600 nm).

Figure 2A:
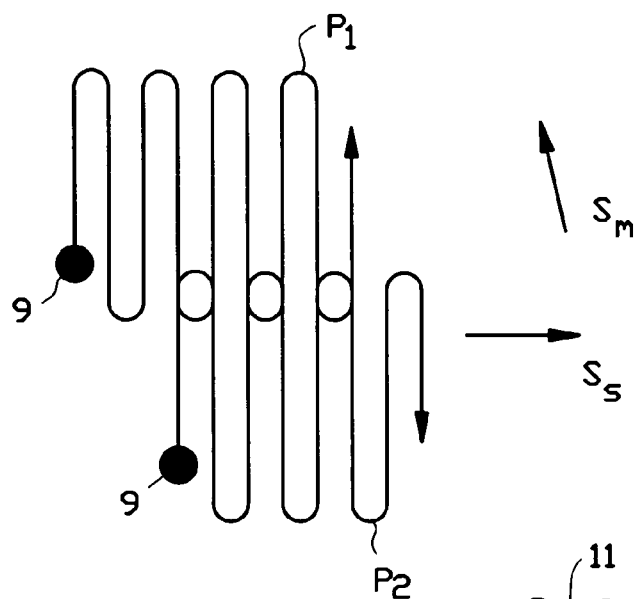
FIGS. 2A-2C show examples of the scanning trajectory of electron beamlets on a wafer to be lithographed.
Figure 2B:
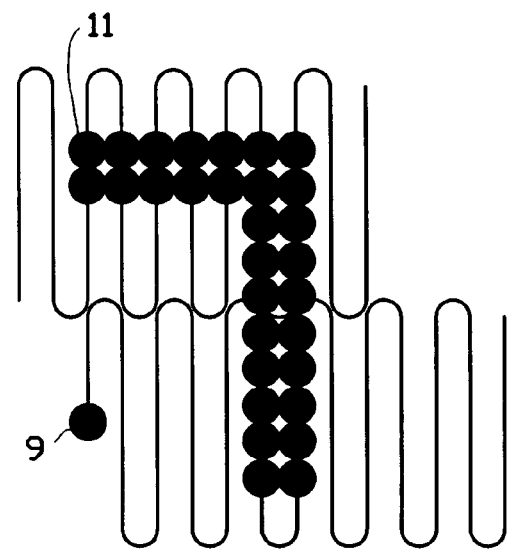
Figure 2C:
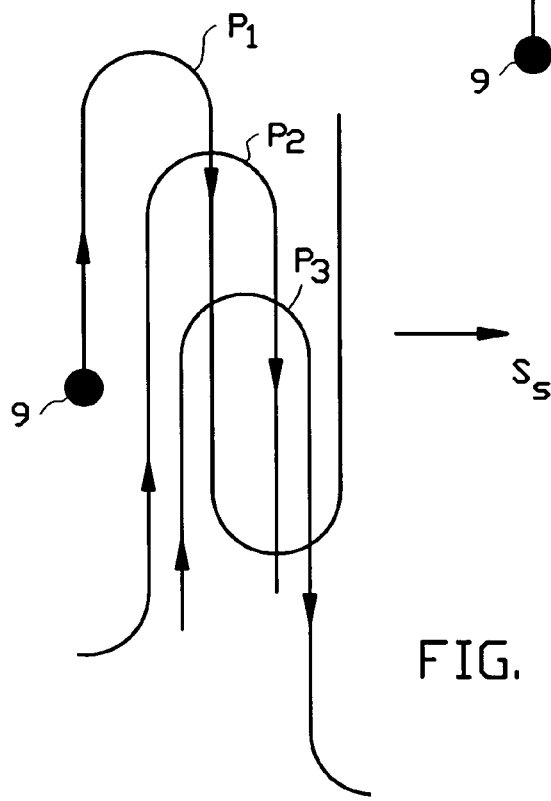

FIGS. 2A-2C show several ways a pattern can be transferred. A substrate or the converter plate is moved in scan direction $S_S$ using for instance a wafer stage. At the same time, using for instance a magnetic field, each electron beamlet having a footprint 9 is scanned at a direction $S_M$, substantially perpendicular to scan direction $S_S$. In this way, the footprints 9 follow the trajectory P1 and P2. The pattern 11 in FIG. 2B can be obtained by activating the cathodes at the right instances. Specifically, to realise trajectories P1 and P2, the scan direction $S_M$ is at an angle with $S_S$ as indicated in FIG. 2A.

FIG. 2C shows and alternative way of scanning, which can avoid the effect of stitching. In this embodiment, three beams follow trajectories P1, P2 and P3.

FIG. 3 shows an alternative embodiment of the direct write lithography system of the current invention. Here, the optical fibers end in one plane. In a specific embodiment, each fiber is provided with a micro lens 43 at its tip. The micro lenses 43 focus a light beam from an optical fiber in a small spot of typically 200-2000 nm in the plane 15. This plane 15 is subsequently projected, using demagnifier 14, onto the converter plate 2. The demagnifier can be a 1:1 projector, or may be capable of projecting at a reduced size, for instance 1:4.

In FIG. 3, furthermore, an aperture plate 40 and electrostatic deflection strips 41 are shown. The electrostatic deflection strips 41 are connected to a power source 42. In this embodiment, the scanning of beamlets 6 is performed by electrostatic means. The electrons are first accelerated towards aperture plate 40. In the second part of their trajectory, after passing the aperture plate 40, the electron beamlets are deflected by strips 41 which carry voltages, alternatively positive and negative. The combination of the focussing magnetic field and the electrostatic field deflects the electrons in a direction perpendicular to both the magnetic (vide FIG. 1) and electrostatic field.

Figure 4:
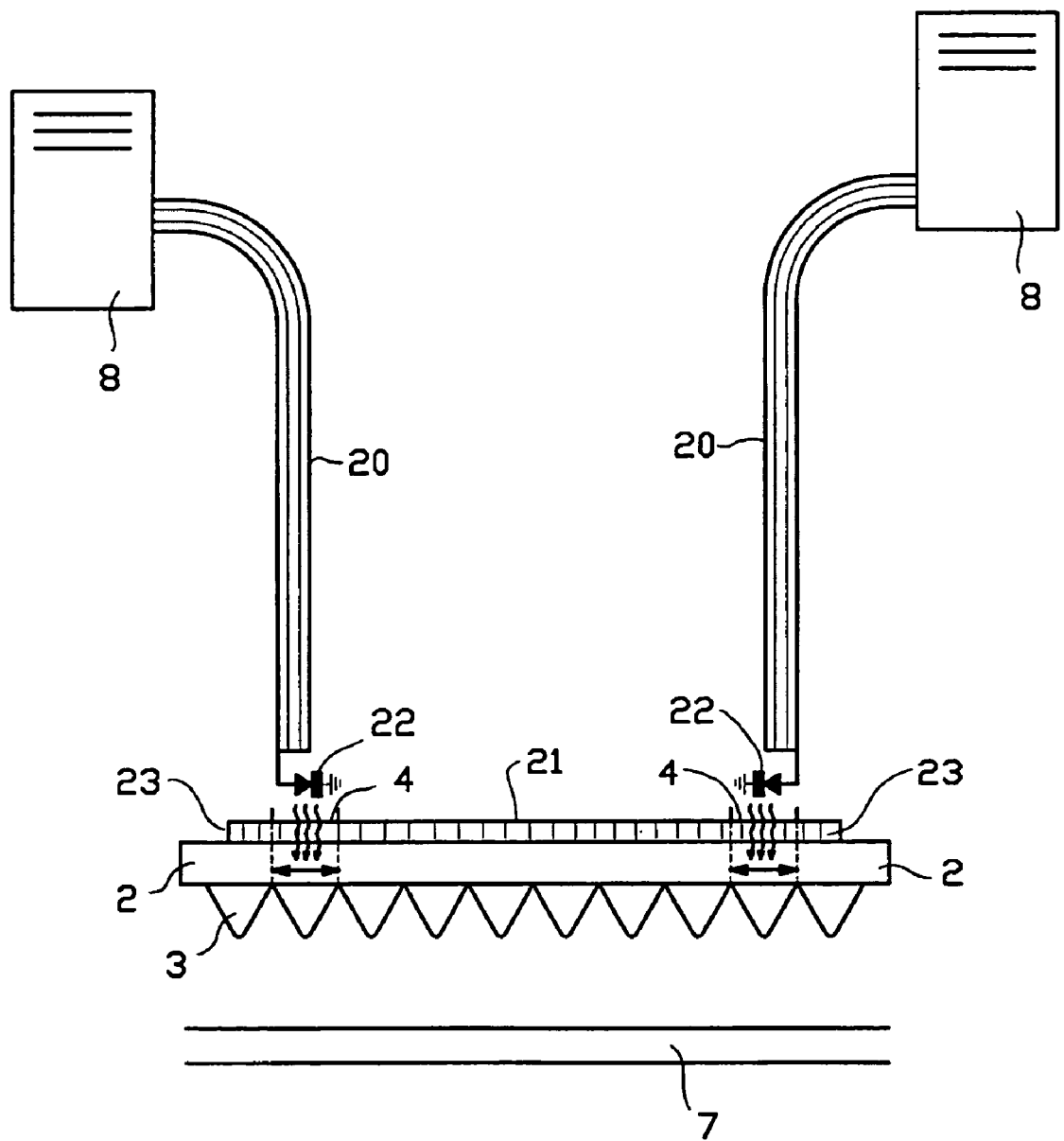
FIG. 4 shows another embodiment of a direct write lithography system of the invention, using light emitting diodes.

Another embodiment of the current invention, shown in FIG. 4, uses an array of light sources close to or directly on top of the converter plate 2. This array of light sources can for instance be an array of light emitting diodes (LED's) 2. The light sources are switched on and off using computer system(s) 8. The light sources are connected to the computer systems 8 by (electronical) data cables 20. In order to reduce cross talk, an optical fiber plate can be placed between the array of light sources and the converter plate 2. In another embodiment, the array of light sources is projected onto the converter plate 2 using a demagnifier, in the way already described in FIG. 3. This allows the array to be bigger in size, which gives for instance more room for electrical systems. In the embodiment of FIG. 4, the aperture plate and electrostatic lenses of FIG. 3 can also be used.

It is to be understood that the above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

I claim:

1. A method of producing a pattern on a substrate in an in vacuum space maskless lithography system using a plurality of simultaneously scanning electron beams, wherein a substrate is moved in a scan direction Ss on a wafer stage, while each electron beam is scanned in a direction Sm substantially perpendicular to the scan direction Ss, wherein data are retrieved from data storage on at least one computer system, said data representing the pattern to be produced on said substrate, said data being processed in said at least one computer system and converted into electrical signals activating and de-activating individually controllable light sources for producing light to be received by an activation area of a lithography system using a plurality of simultaneous scanning electron beams, for controlling the same, said at least one computer and said light sources being located outside the vacuum space, said light being transmitted to the lithographic system by optical fibers, the number of fibers influenced by the use of multiplexing and de-multiplexing, each optical fiber having one end producing a light spot which is projected within the lithography system by means of free space light beam imaging and another end arranged for receiving light from said light sources, wherein the end for producing a light spot of each optical fiber is provided with a microlens at its tip;

said light sources being activated and deactivated on the basis of electrical signals generated by said at least one computer system on the basis of said data to be processed by said lithography system comprised in said at least one computer system, and wherein each light spot is imaged on an activation area in said lithography system, and each imaged light spot is aligned with a corresponding activation area in order to prevent activation of a neighboring activation area.

2. The method according to claim 1, wherein said free space light beam imaging is provided by a lens system comprising a demagnifier.

3. The method according to claim 1, wherein the array of light sources includes one of a light emitting diode and a laser.

4. The method according to claim 1, wherein electron beams are deflected by strips carrying positive and negative voltages alternatively.

5. The method according to claim 1, wherein each individual controllable light source further comprises a semiconductor laser, arranged for coupling light into one of the optical fibers.

6. A Lithography system comprising a writer incorporated in vacuum, said writer comprising a direct write, maskless system using a plurality of simultaneously scanning electron beams deflected in a scan direction Sm substantially perpendicular to a movement direction Ss of a stage carrying a writing target substrate, and a controller for controlling said writer, in which system control signals are entered into said writer by a projection of modulated light signals generated by said controller, the writing system thereto comprising an area for receiving said light signals, said control signals being provided using optical fibers, wherein the number of optical fibers in the system has been reduced relative to the number of electron beams by a multiplexing and de-multiplexing means in said light optical system, each optical fiber having one end for producing a light spot which is projected within the lithography system by means of free space light beam imaging and another end arranged for receiving light from said light sources, wherein said light sources are located outside the vacuum, wherein the end for producing a light spot of each optical fiber is provided with a microlens at its tip for performing said projection;

wherein a light spot is imaged on an activation area in said lithography system, and wherein said imaged light spot is aligned with the activation area in order to prevent activation of a neighboring activation area.

7. System according to claim 6, wherein such light source comprises one of a light emitting diode and a semi conductor laser, arranged for coupling its light into said optical fiber.

8. System according to claim 6, wherein data representing the pattern to be imaged is retrieved from a data storage means on at least one computer.

9. System according to claim 6, wherein the light sources are located away from said writing part, at least outside said vacuum by means of said optical fibers.

* * * * *